United States Patent
Chu et al.

(10) Patent No.: US 7,668,035 B2
(45) Date of Patent: Feb. 23, 2010

(54) MEMORY CIRCUITS WITH REDUCED LEAKAGE POWER AND DESIGN STRUCTURES FOR SAME

(75) Inventors: Sam Gat-Shang Chu, Round Rock, TX (US); Saiful Islam, Austin, TX (US); Jae-Joon Kim, Austin, TX (US); Stephen V. Kosonocky, Fort Collins, CO (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 12/098,764

(22) Filed: Apr. 7, 2008

(65) Prior Publication Data

US 2009/0251974 A1 Oct. 8, 2009

(51) Int. Cl.
*G11C 5/14* (2006.01)
(52) U.S. Cl. .................. 365/227; 365/226; 365/154
(58) Field of Classification Search .......... 365/227, 365/226, 154
See application file for complete search history.

(56) References Cited

U.S. PATENT DOCUMENTS

| | | |
|---|---|---|
| 5,581,500 A | 12/1996 | D'Souza |
| 7,061,794 B1 | 6/2006 | Sabharwal et al. |
| 2005/0002225 A1* | 1/2005 | Kanehara et al. ............ 365/154 |
| 2006/0098474 A1 | 5/2006 | Dang et al. |
| 2007/0081409 A1 | 4/2007 | Wuu et al. |
| 2007/0201270 A1 | 8/2007 | Chatterjee et al. |

OTHER PUBLICATIONS

Weste et al., "Principles of CMOS VLSI Design: A Systems Perspective", Second Edition, pp. 580-582, Addison & Wesley, Redding, 1993.

* cited by examiner

*Primary Examiner*—Amir Zarabian
*Assistant Examiner*—Kretelia Graham
(74) *Attorney, Agent, or Firm*—Ryan, Mason & Lewis, LLP

(57) ABSTRACT

A memory circuit includes a global read bit line, a global read bit line latch, and a plurality of sub-arrays, each of which includes first and second local read bit lines, first and second local write bit lines, and first and second pluralities of memory cells interconnected, respectively, with the first and second local read bit lines and the first and second local write bit lines. The local read bit lines are decoupled from the local write bit lines. A local multiplexing block is interconnected with the first and second local read bit lines and is configured to ground the first and second local read bit lines upon assertion of a SLEEP signal, and to selectively interconnect the local read bit lines to the global read bit line. A global multiplexing block is interconnected with the global read bit line and is configured to maintain the global read bit line in a substantially discharged state upon assertion of the SLEEP signal and to interconnect the global read bit line to the global read bit line latch. Also included are design structures for circuits of the kind described.

17 Claims, 6 Drawing Sheets

US 7,668,035 B2

MEMORY CIRCUITS WITH REDUCED LEAKAGE POWER AND DESIGN STRUCTURES FOR SAME

FIELD OF THE INVENTION

The present invention generally relates to electronic circuitry, with associated design structures, and, more particularly, to electronic memory circuits, such as large register-file arrays, with associated design structures.

BACKGROUND OF THE INVENTION

Typical dynamic bit lines use a pre-charge phase, followed by the evaluate phase, in every cycle. This consumes substantial power, as usually the clock signal CLK acts as the pre-charge, and the clock signal is of course coming in every cycle. When there is no evaluate for a long time, then the dynamic bit lines stay in pre-charge; however, that also causes substantial leakage power through the register array cell's pull-down transistors (usually 8 or 16 cells dotted together—that is, the bit line for each cell is electrically connected). Numerous techniques have been proposed to reduce the active power of dynamic READ, but in scenarios where the array will not be accessed for a long time, the leakage power can be substantial as well.

US Patent Publication number 2006-0098474 of Dang et al. discloses a high performance, low leakage SRAM device and a method of placing a portion of memory cells of an SRAM device in an active mode. In one embodiment, the SRAM device includes (1) a set of memory cells and (2) biasing circuitry, coupled to the set, configured to bias a subset of the set based on a memory address associated therewith.

U.S. Pat. No. 7,061,794 of Sabharwal et al. discloses a word-line-based source-biasing scheme for reducing memory cell leakage. In standby mode, word lines are deselected and a source-biasing potential is provided to SRAM cells. In read mode, a selected word line deactivates the source-biasing potential provided to the selected row of SRAM cells, whereas the remaining SRAM cells on the selected bit line column continue to be source-biased.

U.S. Pat. No. 5,581,500 of D'Souza discloses a memory cell with power supply induced reversed-bias pass transistors for reducing off-leakage current. The memory cell operates within a power supply range that induces the pass transistor(s) of the memory cell to be reversed biased when the memory cell is not being accessed. The memory cell includes a storage element capable of storing either a first data value or a second data value; a pass transistor, coupled to the storage element; and a power supply generator coupled to the storage element. The power supply generator is configured to generate supply level voltages for the storage element so as to induce the pass transistor into a substantially reverse-biased state when the storage element is not being accessed, regardless of whether the storage element is storing the first data value or a second data value.

SUMMARY OF THE INVENTION

Principles of the present invention provide techniques for reducing leakage power in electronic memory circuits, such as large register-file arrays, and the like.

In an exemplary embodiment, according to one aspect of the invention, a memory circuit includes a global read bit line, a global read bit line latch, and a plurality of sub-arrays. Each of the sub-arrays includes a first local read bit line, a first local write bit line, and a first plurality of memory cells interconnected with the first local read bit line and the first local write bit line. The first local read bit line is decoupled from the first local write bit line. Also included are a second local read bit line, a second local write bit line, and a second plurality of memory cells interconnected with the second local read bit line and the second local write bit line. The second local read bit line is decoupled from the second local write bit line.

The exemplary circuit also includes a local multiplexing block interconnected with the first and second local read bit lines and configured to ground the first and second local read bit lines upon assertion of a SLEEP signal, and to selectively interconnect the local read bit lines to the global read bit line. The exemplary circuit further includes a global multiplexing block interconnected with the global read bit line and configured to maintain the global read bit line in a substantially discharged state upon assertion of the SLEEP signal and to interconnect the global read bit line to the global read bit line latch.

In another aspect, the invention includes design structures for circuits of the kind described.

One or more embodiments of the present invention may be realized in the form of an integrated circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1A:
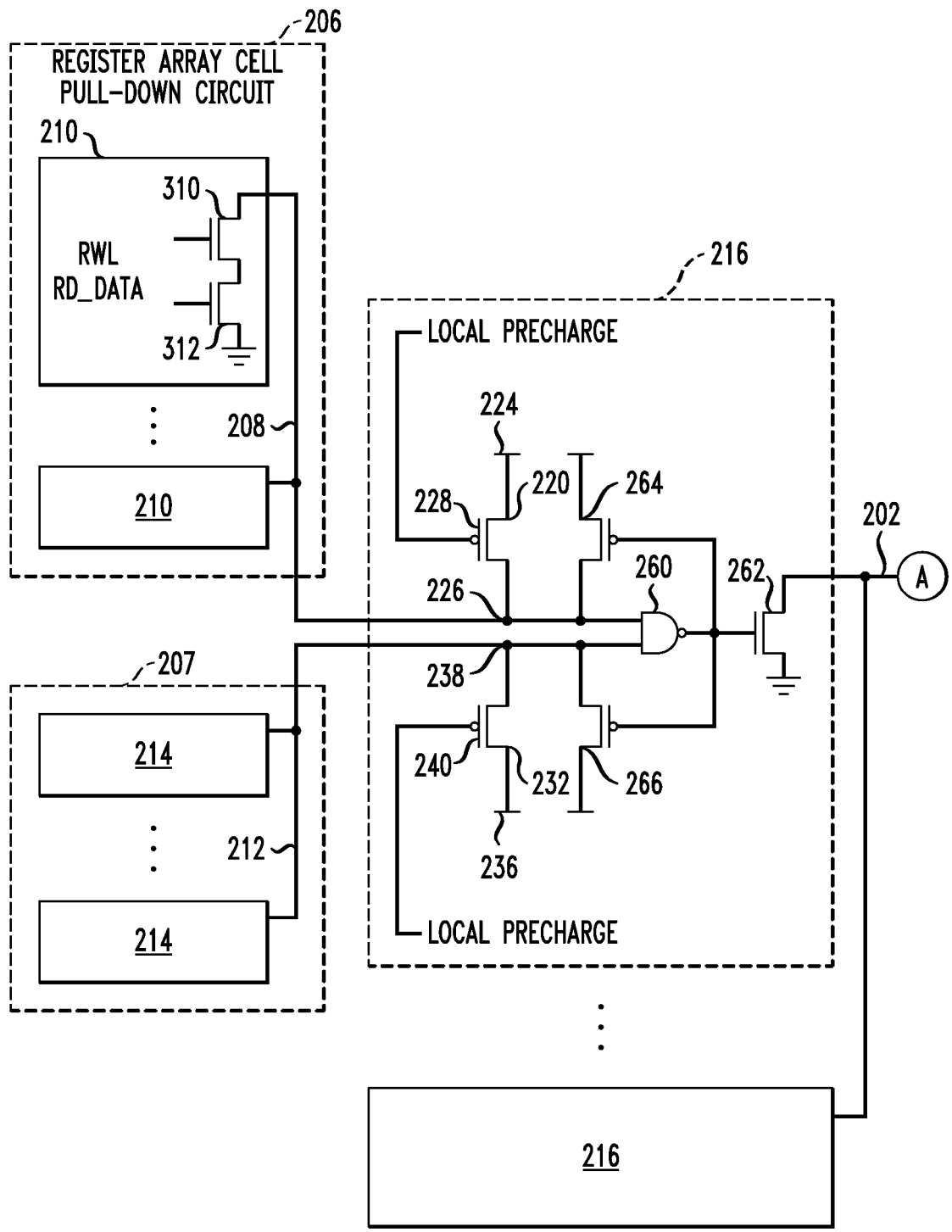
FIGS. 1A-1C show a circuit, as known from the prior art.

Embodiments of the invention discharge the bit lines to ground, instead of keeping them in a pre-charged phase, thereby saving substantial stand-by power (leakage power) in, for example, dynamic register arrays. If and when a large dynamic register array is not required to be accessed for a long period of time, control logic issues a 'SLEEP' signal to the array, and that signal will substantially immediately cause discharge of all local bit lines (LBL) and all global bit lines (GBL) from their pre-charged states. The same SLEEP signal will also disable further pre-charging of local and global bit-lines. When the register array needs to be accessed again, the SLEEP signal will go low (that is, in the exemplary embodiment, assume a "low" or "zero" logical state) and one additional pre-charge-evaluate cycle will bring the array to a normal read mode.

One or more embodiments of this power-saving technique are advantageous when there is a need to shut-down a large dynamic register array for thousands to millions of cycles. This technique will pay a small amount of penalty in real estate (two additional transistors in local multiplexing (muxing) and one additional transistor in global muxing) and in timing (additional diffusion capacitance from the sleep pull-down transistor in the local muxing block), but both penalties are small in low-power designs, as compared to the power saved.

Embodiments of the invention use the aforementioned additional SLEEP signal to put the array into SLEEP mode, where the bit lines are fully discharged, thus, substantially reducing leakage power. In order to better illustrate principles of an embodiment of the invention, reference should first be had to FIGS. 1A-1C, which show a prior art approach. Local bit line (LBL) 208 is dotted with a plurality (for example, eight) register array dynamic cells 210. In the local muxing area 216, this bit line is pre-charged through a pull-up transistor 220. Local bit line (LBL) 208 is then one input of a two-input NAND gate 260. The other input is a local bit line 212 for a bottom plurality (for example, eight) register array dynamic cells 214. The output of gate 260 runs to a pull-down transistor 262 to generate global bit line (GBL) 202. Similarly, in the global muxing area 218, GBL 202 is pre-charged through a pull-up transistor 268 and then runs to a bit line latch 204 to capture the data read from the register array cell.

Figure 1B:
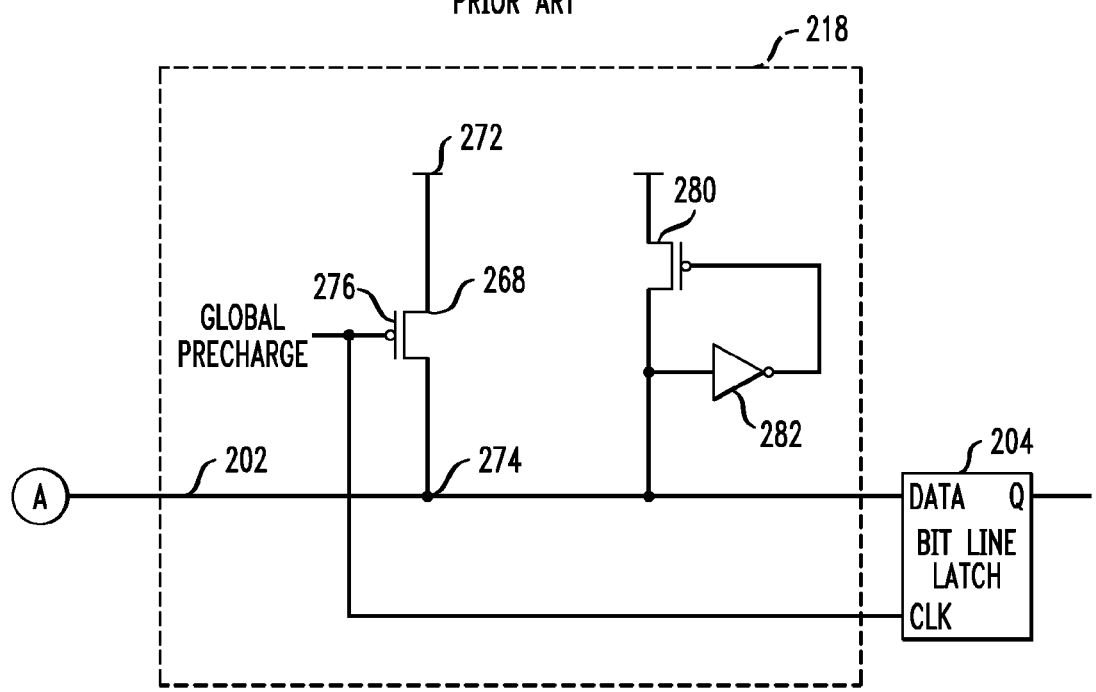
Figure 1C:
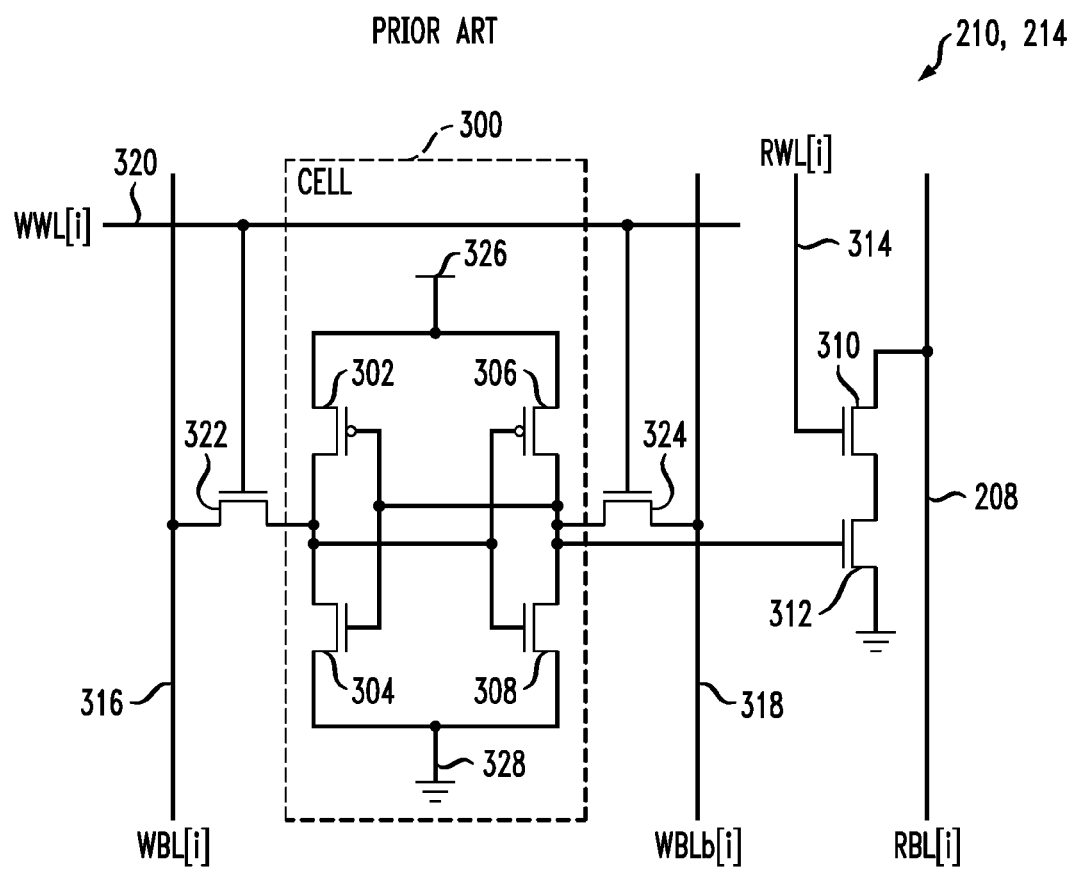

In the prior art configuration of FIGS. 1A-1C, when the array is not accessed for a long time, the bit lines 202, 208, 212 stay in a pre-charged phase (stay at logical "high" or "one"). As a result, the bit lines 208, 212 find all the dotted pull-downs of the cells (in this example, eight) for their leakage paths and therefore, consume substantial leakage power even though the array is not being accessed at that time at all.

The prior art memory circuit thus includes a global read bit line 202, a global read bit line latch 204, and a plurality of sub-arrays. Each sub-array includes a first local read bit line 208; a first local write bit line (which can be a true-complementary pair of local write bit lines, best seen in FIG. 1C); and a first plurality 206 of memory cells 210 interconnected with the first local read bit line and the first local write bit line. The first local read bit line is decoupled from the first local write bit line (i.e., can be accessed independently therefrom). Each sub-array also includes a second local read bit line 212, a second local write bit line (see discussion of FIG. 1C), and a second plurality 207 of memory cells 214 interconnected with the second local read bit line and the second local write bit line. The second local read bit line is decoupled from the second local write bit line.

The prior art circuit also includes local multiplexing block 216 interconnected with the first and second local read bit lines 208, 212, and global multiplexing block 218 interconnected with the global read bit line 202. Local multiplexing block 216 includes a first pull-up transistor 220 having a first drain source terminal 224 connected to a power supply, a second drain-source terminal 226 interconnected to the first local read bit line, and a gate 228 for receiving a local pre-charge signal. Also included is a second pull-up transistors 232 having a first drain source terminal 236 connected to a power supply, a second drain-source terminal 238 interconnected to the second local read bit line, and a gate 240 for receiving a local pre-charge signal. Block 216 also includes NAND gate 260 with first and second inputs interconnected, respectively, with the first and second local read bit lines 208, 212, and with an output connected to the gate of a third pull-down transistor 262, which has a first drain-source terminal coupled to the global read bit line 202, and a grounded second drain-source terminal. Transistors 264 and 266 form a keeper circuit to hold the nodes 226 and 238 against noise. The gates of transistors 264, 266 are connected to the output of NAND gate 260.

Global multiplexing block 218 includes a global pull-up transistor 268 having a first drain-source terminal 272 connected to a power supply, a second drain-source terminal 274 interconnected to the global read bit line 202, and a gate 276 for receiving a global pre-charge signal. P-type field effect transistor (PFET) 280 and inverter 282 form a keeper circuit. For example, the inverter output voltage is ground (GND) when the node 274 voltage is (supply voltage) VDD and the transistor 280 is turned on to hold the voltage at node 274. If there is leakage current from the node 274, the keeper will suppress the noise. If there is a strong evaluation current from the node 274, such current will overcome the keeper current and finish the correct evaluation.

Note that the number of blocks 210, 214 in each plurality 206, 207 of cells (eight blocks in the example) can vary depending on applications. Similarly, the number of local mux blocks 216 (four in the example) can also vary depending on the application. FIG. 1C shows exemplary details of the contents of blocks 210, 214. Cell 300 includes a first inverter formed by PFET 302 and NFET 304 cross-coupled to a second inverter formed by PFET 306 and NFET 308. The signal RD_DATA shown in block 210 (similar to block 214) on the gate of transistor 312 is from a cell 300 and the signal RWL on the gate of transistor 310 is from the read word line 314 for the $i^{th}$ cell 300. The cross-coupled inverters are selectively interconnected with true and complementary write bit lines 316, 318 when write word line 320 applies a signal to the gates of access transistors 322, 324. Elements 326, 328 are, respectively, a power supply node and a ground node.

Figure 2A:
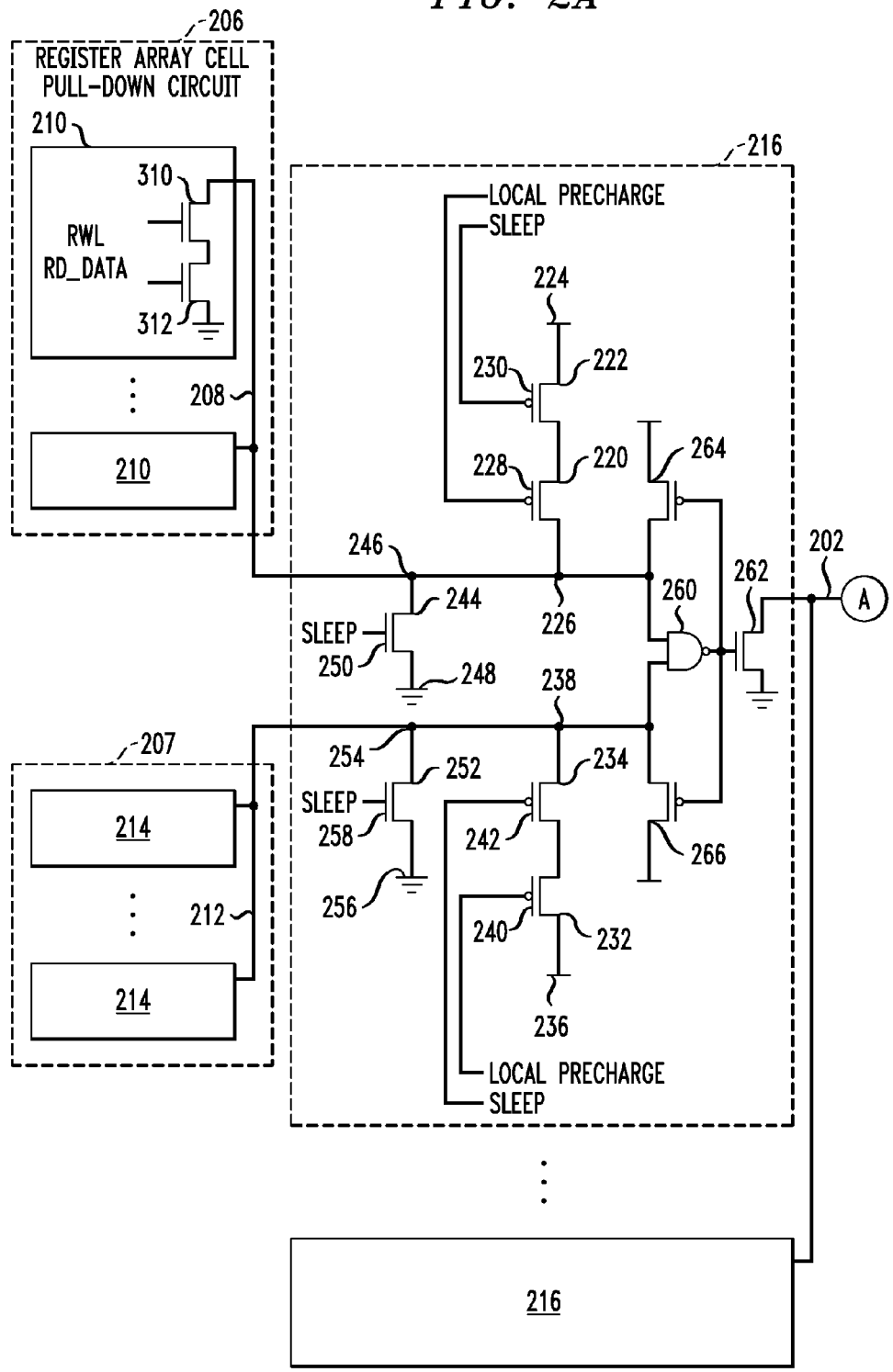
FIGS. 2A and 2B show an exemplary circuit, according to an aspect of the invention.
Figure 2B:
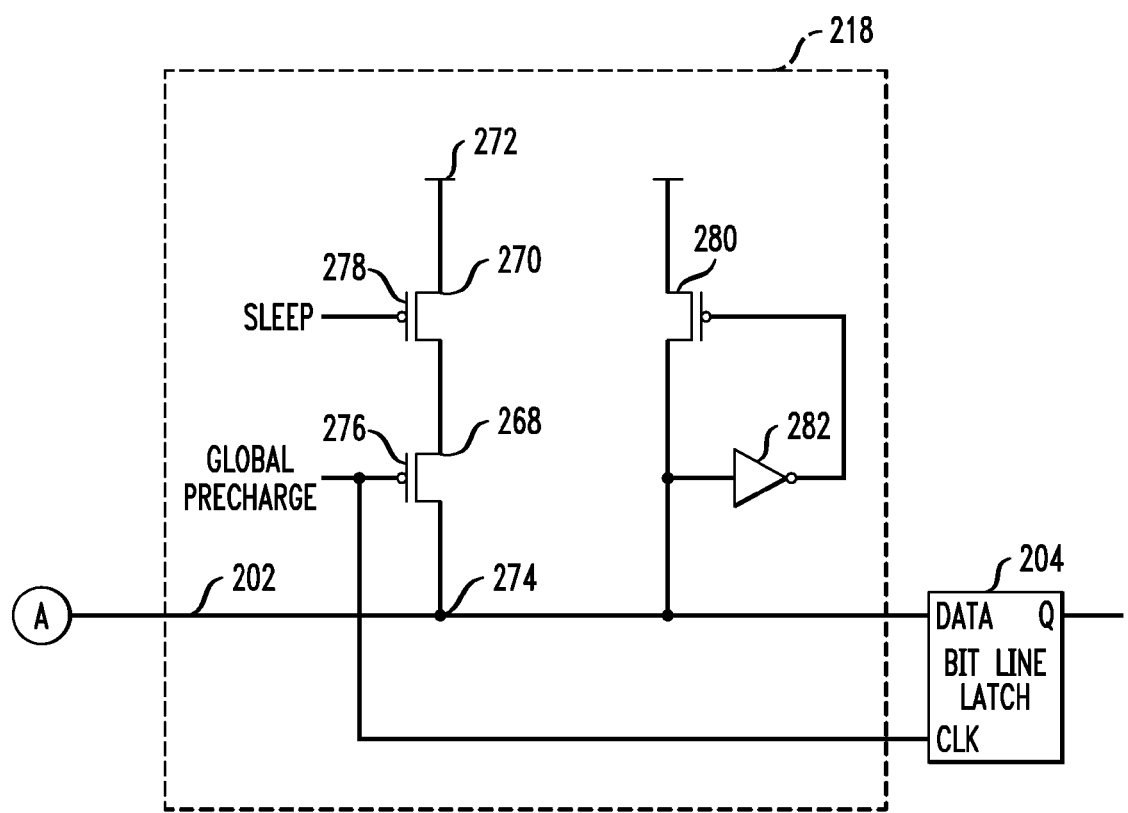
Figure 2B:
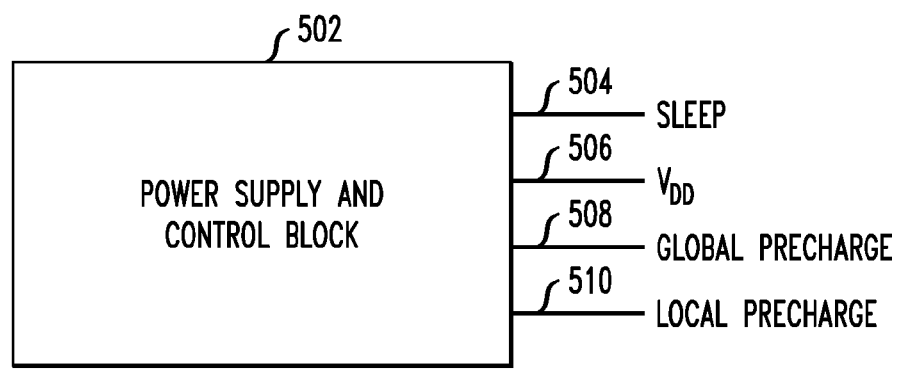

Reference should now be had to FIGS. 2A and 2B, which depict an exemplary embodiment of a circuit in accordance with an aspect of the invention. Elements somewhat similar to those in FIGS. 1A-1C have received the same reference character. In the exemplary embodiment, local multiplexing in block 216 is modified such that small-sized pull-down transistors 244, 252 are added, with their gates 250, 258 connected to a SLEEP signal. Also, pull-up transistors 222, 234 are added in series with the pre-charge pull-up transistors 220, 232. The gates of transistors 222, 234 are also connected to the SLEEP signal so that pre-charging is disabled during the SLEEP mode. As the sleep pull-down transistors 244, 252 are made very small in size (even a small size is enough to pull-down the local bit lines 208, 212, as this discharging will not run in full-cycle), the time penalty on a normal READ is extremely small. Pull-down transistors 244, 252 can preferably but optionally be made as small as possible (subject to the limitations of whatever technology is used to fabricate the circuit) since the discharge time is typically not important. "Small" refers to the device width as compared to other transistors in the circuit. To keep the global bit line 202 fully discharged as well, during the 'SLEEP' mode, an additional pull-up transistor 270 is also added in series with the global pre-charge pull-up transistor 268, so that pre-charging is disabled during 'SLEEP' mode.

Thus, in the exemplary inventive circuit of FIGS. 2A and 2B, local multiplexing block 216 is configured to ground the first and second local read bit lines 208, 212 upon assertion of a SLEEP signal and to selectively interconnect the local read bit lines 208, 212 to the global read bit line 202. Further, in the exemplary inventive circuit of FIGS. 2A and 2B, global multiplexing block 218 is configured to maintain the global read bit line 202 in a substantially discharged state upon assertion of a SLEEP signal and to interconnect the global read bit line 202 to the global read bit line latch 204.

By way of review and provision of additional details, in the exemplary embodiment, local multiplexing block 216 includes a first pair of series pull-up transistors 220, 222 having a power supply terminal 224 (one drain-source terminal of transistor 222) and a terminal 226 (one drain-source terminal of transistor 220) interconnected to the first local read bit line 208. The first transistor of the first pair of series pull-up transistors, 220, has a gate 228 for receiving a local pre-charge signal and the second transistor of the first pair of series pull-up transistors, 222, has a gate 230 for receiving the SLEEP signal. The other drain source terminals of transistors 220, 222 are connected.

Also included are a second pair of series pull-up transistors 232, 234 having a power supply terminal 236 (one drain-source terminal of transistor 232) and a terminal 238 (one drain-source terminal of transistor 234) interconnected to the second local read bit line 212. The first of the second pair of series pull-up transistors 232 has a gate 240 for receiving a local pre-charge signal and the second of the second pair of series pull-up transistors 234 has a gate 242 for receiving the SLEEP signal. Block 216 further includes first pull-down transistor 244 having a first drain-source terminal 246 interconnected to the first local read bit line, a grounded second drain-source terminal 248, and a gate 250 for receiving the SLEEP signal; as well as second pull-down transistor 252 having a first drain-source terminal 254 interconnected to the second local read bit line, a grounded second drain-source terminal 256, and a gate 258 for receiving the SLEEP signal. The other drain-source terminals of transistors 232, 234 are connected.

Global multiplexing block 218 includes a pair of global series pull-up transistors 268, 270 having a power supply terminal 272 (one drain-source terminal of transistor 270) and a terminal 274 (one drain-source terminal of transistor 268) interconnected to the global read bit line. The first transistor of the pair of global series pull-up transistors 268 has a gate 276 for receiving a global pre-charge signal and the second transistor of the pair of global series pull-up transistors 270 has a gate 278 for receiving the SLEEP signal. The contents of cells 210, 214 are similar to the depiction in FIG. 1C. The other drain-source terminals of transistors 268, 270 are connected.

As seen in FIG. 2B, the exemplary inventive circuit can include a power supply and control block 502, with SLEEP, supply voltage, global pre-charge, and local pre-charge terminals 504, 506, 508, 510, respectively. Block 502 can be configured to provide a supply voltage, $V_{DD}$, to the power supply terminals 224, 236 of the first and second pairs of series pull-up transistors and the power supply terminal 272 of the pair of global series pull-up transistors; and to provide the SLEEP signal. The supply voltage, $V_{DD}$, can also be provided to other power supply terminals, such as 326 and the power supply terminals depicted for transistors 264, 266, 280 (not separately numbered).

The SLEEP signal can be provided by block 502 when the system needs to go to "stand-by (or SLEEP)" mode for power reduction purposes. The terminals of the block 502 can be connected to the indicated locations in the circuit (connections omitted for illustrative clarity).

In another aspect, the invention includes an exemplary method, including the steps of providing a memory circuit of the kind described, and asserting the SLEEP signal to cause (i) the grounding of the first and second local read bit lines and (ii) the global read bit line to be maintained in the substantially discharged state, whereby stand-by power consumption is reduced in the circuit. The step of asserting the SLEEP signal can include applying the SLEEP signal to the gates 250, 258 of the first and second pull-down transistors 244, 252, the gate 230 of the second transistor 222 of the first pair of series pull-up transistors, and the gate 242 of the second transistor 234 of the second pair of series pull-up transistors. Such step can also include applying the SLEEP signal to the gate 278 of the second transistor 270 of the pair of global series pull-up transistors.

Circuits according to one more aspects of the present invention may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the circuits described herein, and may include other structures or circuits, or circuits having other types of cells. The individual die are cut or diced from the wafer, then packaged as an integrated circuit. A person of skill in the art will know how to dice wafers and package die to produce integrated circuits. Integrated circuits so manufactured are considered part of the present invention.

Circuits as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

Figure 3:
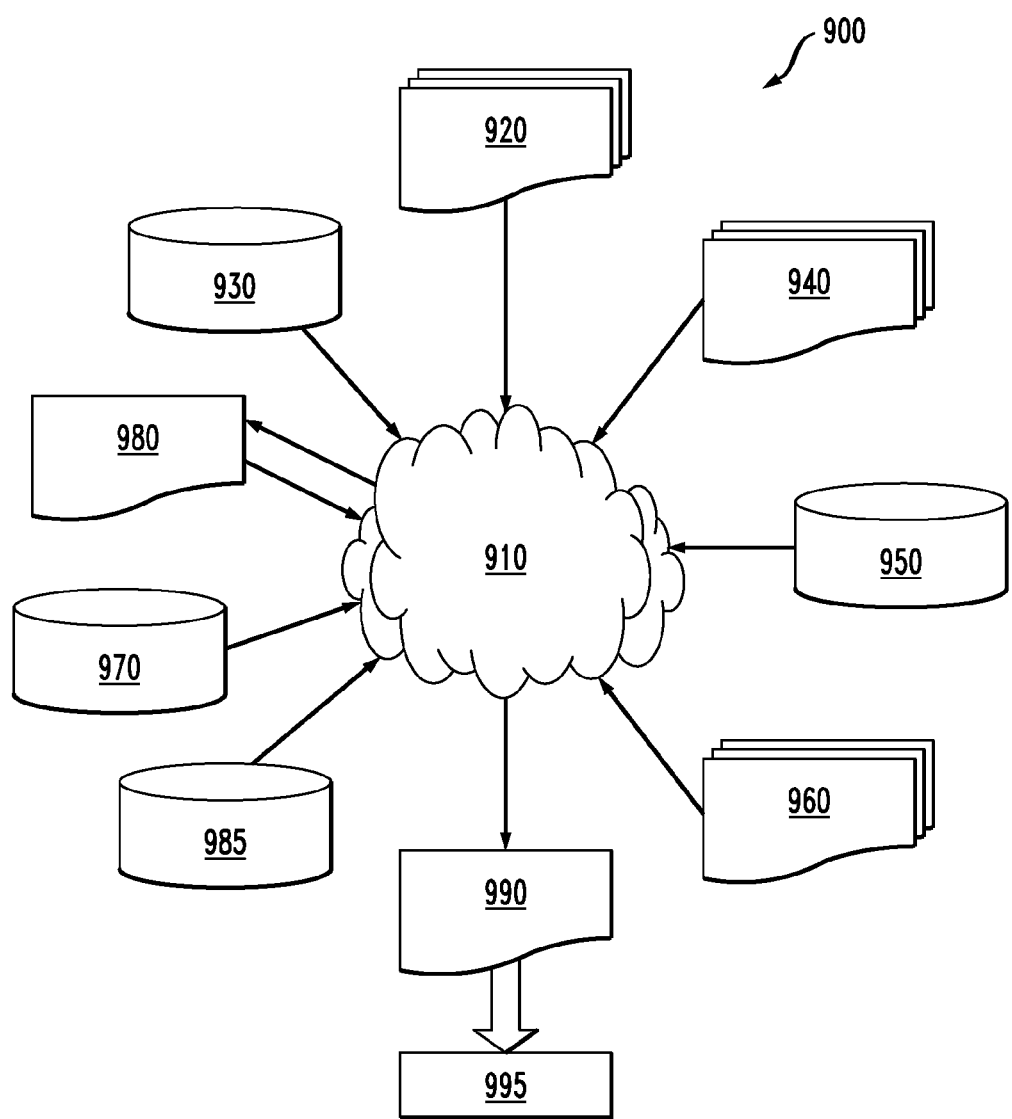
FIG. 3 is a flow diagram of a design process used in semiconductor design, manufacture, and/or test.

FIG. 3 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 2A and 2B. The design strictures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2A and 2B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2A and 2B to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2A and 2B. In one embodiment, design structure 990 may comprise a compiled, executable HDL simulation model that functionally simulates the devices shown in FIGS. 2A and 2B.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2A and 2B. Design structure 990 may then proceed to a stage 995 where, for example, design structure 990: proceeds to tape-out, is released to manufacturing, is released to a mask house, is sent to another design house, is sent back to the customer, etc.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A memory circuit comprising:
    a global read bit line;

a global read bit line latch;
a plurality of sub-arrays, each of said sub-arrays comprising:
a first local read bit line;
a first local write bit line;
a first plurality of memory cells interconnected with said first local read bit line and said first local write bit line, said first local read bit line being decoupled from said first local write bit line;
a second local read bit line;
a second local write bit line;
a second plurality of memory cells interconnected with said second local read bit line and said second local write bit line, said second local read bit line being decoupled from said second local write bit line; and
a local multiplexing block interconnected with said first and second local read bit lines and configured to ground said first and second local read bit lines upon assertion of a SLEEP signal and to selectively interconnect said local read bit lines to said global read bit line; and
a global multiplexing block interconnected with said global read bit line and configured to maintain said global read bit line in a substantially discharged state upon assertion of said SLEEP signal and to interconnect said global read bit line to said global read bit line latch.

2. The circuit of claim 1, wherein each of said local multiplexing blocks comprises:
a first pair of series pull-up transistors having a power supply terminal and a terminal interconnected to said first local read bit line, a first transistor of said first pair of series pull-up transistors having a gate for receiving a local pre-charge signal and a second transistor of said first pair of series pull-up transistors having a gate for receiving said SLEEP signal;
a second pair of series pull-up transistors having a power supply terminal and a terminal interconnected to said second local read bit line, a first transistor of said second pair of series pull-up transistors having a gate for receiving a local pre-charge signal and a second transistor of said second pair of series pull-up transistors having a gate for receiving said SLEEP signal;
a first pull-down transistor having a first terminal interconnected to said first local read bit line, a grounded second terminal, and a gate for receiving said SLEEP signal;
a second pull-down transistor having a first terminal interconnected to said second local read bit line, a grounded second terminal, and a gate for receiving said SLEEP signal;
a NAND gate having first and second inputs interconnected, respectively, with said first and second local read bit lines, and having an output; and
a third pull-down transistor having a first terminal coupled to said global read bit line, a grounded second terminal, and a gate coupled to said output of said NAND gate.

3. The circuit of claim 2, wherein said global multiplexing block comprises a pair of global series pull-up transistors having a power supply terminal and a terminal interconnected to said global read bit line, a first transistor of said pair of global series pull-up transistors having a gate for receiving a global pre-charge signal and a second transistor of said pair of global series pull-up transistors having a gate for receiving said SLEEP signal.

4. The circuit of claim 3, further comprising a power supply and control block configured to:
provide a supply voltage to said power supply terminals of said first and second pairs of series pull-up transistors and said power supply terminal of said pair of global series pull-up transistors; and
provide said SLEEP signal.

5. The circuit of claim 4, wherein said first and second pull-down transistors of said local multiplexing blocks are relatively small, as compared to at least some other transistors among said transistors in said circuit.

6. The circuit of claim 1, wherein said global multiplexing block comprises a pair of global series pull-up transistors having a power supply terminal and a terminal interconnected to said global read bit line, a first transistor of said pair of global series pull-up transistors having a gate for receiving a global pre-charge signal and a second transistor of said pair of global series pull-up transistors having a gate for receiving said SLEEP signal.

7. A design structure embodied in a machine readable medium, said design structure comprising a memory circuit, said memory circuit comprising:
a global read bit line;
a global read bit line latch;
a plurality of sub-arrays, each of said sub-arrays comprising:
a first local read bit line;
a first local write bit line;
a first plurality of memory cells interconnected with said first local read bit line and said first local write bit line, said first local read bit line being decoupled from said first local write bit line;
a second local read bit line;
a second local write bit line;
a second plurality of memory cells interconnected with said second local read bit line and said second local write bit line, said second local read bit line being decoupled from said second local write bit line; and
a local multiplexing block interconnected with said first and second local read bit lines and configured to ground said first and second local read bit lines upon assertion of a SLEEP signal and to selectively interconnect said local read bit lines to said global read bit line; and
a global multiplexing block interconnected with said global read bit line and configured to maintain said global read bit line in a substantially discharged state upon assertion of said SLEEP signal and to interconnect said global read bit line to said global read bit line latch.

8. The design structure of claim 7, wherein each of said local multiplexing blocks comprises:
a first pair of series pull-up transistors having a power supply terminal and a terminal interconnected to said first local read bit line, a first transistor of said first pair of series pull-up transistors having a gate for receiving a local pre-charge signal and a second transistor of said first pair of series pull-up transistors having a gate for receiving said SLEEP signal;
a second pair of series pull-up transistors having a power supply terminal and a terminal interconnected to said second local read bit line, a first transistor of said second pair of series pull-up transistors having a gate for receiving a local pre-charge signal and a second transistor of said second pair of series pull-up transistors having a gate for receiving said SLEEP signal;
a first pull-down transistor having a first terminal interconnected to said first local read bit line, a grounded second terminal, and a gate for receiving said SLEEP signal;

a second pull-down transistor having a first terminal interconnected to said second local read bit line, a grounded second terminal, and a gate for receiving said SLEEP signal;

a NAND gate having first and second inputs interconnected, respectively, with said first and second local read bit lines, and having an output; and a third pull-down transistor having a first terminal coupled to said global read bit line, a grounded second terminal, and a gate coupled to said output of said NAND gate.

9. The design structure of claim 8, wherein said global multiplexing block comprises a pair of global series pull-up transistors having a power supply terminal and a terminal interconnected to said global read bit line, a first transistor of said pair of global series pull-up transistors having a gate for receiving a global pre-charge signal and a second transistor of said pair of global series pull-up transistors having a gate for receiving said SLEEP signal.

10. The design structure of claim 9, further comprising a power supply and control block configured to:
provide a supply voltage to said power supply terminals of said first and second pairs of series pull-up transistors and said power supply terminal of said pair of global series pull-up transistors; and
provide said SLEEP signal.

11. The design structure of claim 10, wherein said first and second pull-down transistors of said local multiplexing blocks are relatively small, as compared to at least some other transistors among said transistors in said circuit.

12. The design structure of claim 7, wherein said global multiplexing block comprises a pair of global series pull-up transistors having a power supply terminal and a terminal interconnected to said global read bit line, a first transistor of said pair of global series pull-up transistors having a gate for receiving a global pre-charge signal and a second transistor of said pair of global series pull-up transistors having a gate for receiving said SLEEP signal.

13. The design structure of claim 7, wherein said design structure comprises a netlist.

14. The design structure of claim 7, wherein said design structure resides on storage medium as a data format used for exchange of layout data of integrated circuits.

15. A method comprising:
providing a memory circuit, said memory circuit comprising:
a global read bit line;
a global read bit line latch;
a plurality of sub-arrays, each of said sub-arrays comprising:
a first local read bit line;
a first local write bit line;
a first plurality of memory cells interconnected with said first local read bit line and said first local write bit line, said first local read bit line being decoupled from said first local write bit line;
a second local read bit line;
a second local write bit line;
a second plurality of memory cells interconnected with said second local read bit line and said second local write bit line, said second local read bit line being decoupled from said second local write bit line; and
a local multiplexing block interconnected with said first and second local read bit lines and configured to ground said first and second local read bit lines upon assertion of a SLEEP signal and to selectively interconnect said local read bit lines to said global read bit line; and
a global multiplexing block interconnected with said global read bit line and configured to maintain said global read bit line in a substantially discharged state upon assertion of said SLEEP signal and to interconnect said global read bit line to said global read bit line latch; and
asserting said SLEEP signal to cause (i) said grounding of said first and second local read bit lines and (ii) said global read bit line to be maintained in said substantially discharged state;
whereby stand-by power consumption is reduced in said circuit.

16. The method of claim 15, wherein each of said local multiplexing blocks comprises:
a first pair of series pull-up transistors having a power supply terminal and a terminal interconnected to said first local read bit line, a first transistor of said first pair of series pull-up transistors having a gate for receiving a local pre-charge signal and a second transistor of said first pair of series pull-up transistors having a gate for receiving said SLEEP signal;
a second pair of series pull-up transistors having a power supply terminal and a terminal interconnected to said second local read bit line, a first transistor of said second pair of series pull-up transistors having a gate for receiving a local pre-charge signal and a second transistor of said second pair of series pull-up transistors having a gate for receiving said SLEEP signal;
a first pull-down transistor having a first terminal interconnected to said first local read bit line, a grounded second terminal, and a gate for receiving said SLEEP signal;
a second pull-down transistor having a first terminal interconnected to said second local read bit line, a grounded second terminal, and a gate for receiving said SLEEP signal;
a NAND gate having first and second inputs interconnected, respectively, with said first and second local read bit lines, and having an output; and
a third pull-down transistor having a first terminal coupled to said global read bit line, a grounded second terminal, and a gate coupled to said output of said NAND gate; and
wherein said step of asserting said SLEEP signal comprises applying said SLEEP signal to:
said gates of said first and second pull-down transistors;
said gate of said second transistor of said first pair of series pull-up transistors; and
said gate of said second transistor of said second pair of series pull-up transistors.

17. The method of claim 16, wherein said global multiplexing block comprises a pair of global series pull-up transistors having a power supply terminal and a terminal interconnected to said global read bit line, a first transistor of said pair of global series pull-up transistors having a gate for receiving a global pre-charge signal and a second transistor of said pair of global series pull-up transistors having a gate for receiving said SLEEP signal; and
wherein said step of asserting said SLEEP signal further comprises applying said SLEEP signal to said gate of said second transistor of said pair of global series pull-up transistors.

* * * * *